United States Patent
Fu et al.

(10) Patent No.: US 6,713,406 B1
(45) Date of Patent: Mar. 30, 2004

(54) METHOD FOR DEPOSITING DIELECTRIC MATERIALS ONTO SEMICONDUCTOR SUBSTRATES BY HDP (HIGH DENSITY PLASMA) CVD (CHEMICAL VAPOR DEPOSITION) PROCESSES WITHOUT DAMAGE TO FET ACTIVE DEVICES

(75) Inventors: Chu-Yun Fu, Taipei (TW); Kuo-Chyuan Tzeng, Hsin-chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 82 days.

(21) Appl. No.: 09/809,833

(22) Filed: Mar. 19, 2001

(51) Int. Cl.[7] .................. H01L 21/302; H01L 21/461
(52) U.S. Cl. .................. 438/771; 438/783; 438/787
(58) Field of Search .................. 438/783, 787, 438/772, 771, 585, 778; 257/632, 646; 432/93

(56) References Cited

U.S. PATENT DOCUMENTS

| | | | |
|---|---|---|---|
| 5,937,323 A | 8/1999 | Orczyk et al. | 438/624 |
| 6,004,863 A | 12/1999 | Jang | 438/427 |
| 6,040,223 A * | 3/2000 | Liu et al. | 438/303 |
| 6,070,550 A * | 6/2000 | Ravi et al. | 118/723 E |
| 6,090,714 A * | 7/2000 | Jang et al. | 438/692 |
| 6,346,302 B2 * | 2/2002 | Kishimoto et al. | 427/569 |
| 6,372,664 B1 * | 4/2002 | Jang et al. | 438/624 |
| 6,372,670 B1 * | 4/2002 | Maeda | 438/627 |
| 6,410,427 B1 * | 6/2002 | Hu | 438/655 |
| 6,423,653 B1 * | 7/2002 | Fu et al. | 438/17 |

* cited by examiner

*Primary Examiner*—George Fourson
*Assistant Examiner*—Fernando Toledo
(74) *Attorney, Agent, or Firm*—George O. Saile; Stephen B. Ackerman

(57) ABSTRACT

Improved processes for depositing dielectric layers by HDP (High Density Plasma) CVD (Chemical Vapor Deposition) are described. One method controls the RF power applied to the side source RF power to be less than about 2500 Watts during dielectric deposition. A second method controls the thickness of the HDP-CVD deposited dielectric layer to be less than between about 2000 and 3000 Angstroms. These methods of HDP-CVD deposition of dielectric layers result in elimination or suppression of plasma induced damage to MOSFET devices and improved gate oxide integrity of MOSFET devices following deposition of dielectric layers by HDP-CVD.

16 Claims, 2 Drawing Sheets

METHOD FOR DEPOSITING DIELECTRIC MATERIALS ONTO SEMICONDUCTOR SUBSTRATES BY HDP (HIGH DENSITY PLASMA) CVD (CHEMICAL VAPOR DEPOSITION) PROCESSES WITHOUT DAMAGE TO FET ACTIVE DEVICES

BACKGROUND OF THE INVENTION (1) Field of the Invention

This invention relates to a method of fabrication used for semiconductor integrated circuit devices, and more specifically to the formation of reliable dielectric layers capable of filling gaps having widths less than 0.15 μm to 0.25 μm without voids in the dielectric layer and without damage to underlying circuit devices.

(2) Description of Related Art

In the fabrication of semiconductor integrated circuits the integrated circuit devices are connected internally and externally to the semiconductor substrates upon which they are formed through the use of patterned conductor layers which are separated by dielectric layers. As integrated circuit microelectronics fabrication integration levels have increased and integrated circuit device and patterned conductor layer dimensions have decreased, the spacings between adjacent features on a substrate have, also, decreased. Therefore, an important challenge, when depositing dielectric layers, is to provide voidless gapfill capability over high aspect ratio (up to 5) trenches, where aspect ratio is defined as the height of the trench divided by the width of the trench.

Many approaches to fill gaps with dielectric material have been proposed, as shown in the following patents. U.S. Pat. No. 5,937,323 entitled "Sequencing of The Recipe Steps For The Optimal Low-K HDP-CVD Processing" granted Aug. 10, 1999 to Maciek Orczyk et al. describes a method for producing a stable, halogen-doped silicon oxide layer using a high-density plasma chemical vapor deposition (HDP-CVD) system. The sequence of steps includes introducing a substrate into a chamber and setting an initial chamber pressure with process gases. Then, a plasma is formed by applying radio frequency (RF) power to a plasma coupling structure, whereby the substrate is heated to a temperature above 100° C. prior to layer deposition. Layer deposition comprises a relatively thin layer of undoped silicon oxide deposited onto the substrate having a temperature above 100° C., followed by a thicker layer of a halogen-containing silicon oxide. During deposition of the halogen-containing silicon oxide layer the radio frequency (RF) power applied to the plasma coupling structure is reduced in order to suppress heating of the substrate.

And, U.S. Pat. No. 6,004,863 entitled "Non-Polishing Sacrificial Layer Etchback Planarizing Method For Forming A Planarized Aperture Fill Layer" granted Dec. 21, 1999 to Syun-Ming Jang describes a high-density plasma chemical vapor deposition (HDP-CVD) process which employs both a side source of radio frequency power and a top source of radio frequency power.

In general, HDP (High Density Plasma) CVD (Chemical Vapor Deposition) processes have been used for deposition of dielectric layers and can provide voidless gapfill over high aspect ratio features. However, high density plasma processes can, also, induce damage to underlying semiconductor circuit devices. FET devices having thin gate oxide are particularly vulnerable to plasma induced damage (PID). Subjecting such devices to high density plasma deposition processes, as used for the deposition of dielectric layers, can damage the gate oxide and result in reduced process yield. Furthermore, PID can result in degraded device reliability because the integrity of the gate oxide is compromised. For these reasons utilization of HDP-CVD for deposition of IPO (Inter-Poly-Oxide) dielectric or ILD (Inter-Level Dielectric) has not gained acceptance.

The present invention is directed to a novel method of depositing dielectric layers using high-density plasma chemical vapor deposition (HDP-CVD). The novel process permits voidless gapfill over high aspect ratio trenches and minimization of plasma induced damage to underlying semiconductor circuit devices.

SUMMARY OF THE INVENTION

It is a general object of the present invention to provide an improved method of depositing dielectric layers by HDP-CVD (High-Density Plasma Chemical Vapor Deposition) onto semiconductor substrates containing integrated circuit devices.

A more specific object of the present invention is to provide an improved method of depositing dielectric layers by HDP-CVD (High-Density Plasma Chemical Vapor Deposition) onto semiconductor substrates containing integrated circuit devices, whereby the deposited dielectric layer produces voidless gapfill over high aspect ratio trenches.

Another object of the present invention is to provide an improved method of depositing dielectric layers by HDP-CVD (High-Density Plasma Chemical Vapor Deposition) onto semiconductor substrates containing integrated circuit devices, whereby the deposited dielectric layer produces voidless gapfill over high aspect ratio trenches and with minimization of plasma induced damage to underlying semiconductor circuit devices.

In accordance with the present invention, the above and other objectives are realized by using a method of forming a dielectric layer by HDP-CVD (High-Density Plasma Chemical Vapor Deposition) onto a semiconductor substrate containing active circuit devices, the method comprising the following steps: providing a semiconductor substrate, having active circuit devices therein; loading the semiconductor substrate, having active circuit devices therein, into a HDP-CVD (High-Denisty Plasma Chemical Vapor Deposition) system having at least two RF power sources; heating the semiconductor substrate, having active circuit devices therein, to a temperature in the range between about 400 and 700° C.; flowing process gases into the HDP-CVD system under conditions suitable for depositing the dielectric layer; controlling the RF power to one of the at least two RF power sources in the range between about 1000 and 2000 Watts; controlling the RF power to the second of at least two RF power sources to be less than about 2000 to 2500 Watts; and depositing the dielectric layer to a thickness between about 1000 and 20,000 Angstroms.

In a second embodiment of the present invention, the above and other objectives are realized by using a method of forming a dielectric layer by HDP-CVD (High-Density Plasma Chemical Vapor Deposition) onto a semiconductor substrate containing active circuit devices, the method comprising the following steps: providing a semiconductor substrate, having active circuit devices therein; loading the semiconductor substrate, having active circuit devices therein, into a HDP-CVD (High-Denisty Plasma Chemical Vapor Deposition) system having at least two RF power sources; heating the semiconductor substrate, having active circuit devices therein, to a temperature in the range between about 400 and 700° C.; flowing process gases into the HDP-CVD system under conditions suitable for depositing the dielectric layer; controlling the RF power to one of the at least two RF power sources in the range between about 1000 and 2000 Watts; controlling the RF power to the second of at least two RF power sources in the range between about 1500 and 2500 Watts; and depositing the dielectric layer to a thickness less than about 20,000 Angstroms.

In a third embodiment of the present invention, the above and other objectives are realized by using a method of forming a dielectric layer by HDP-CVD (High-Density Plasma Chemical Vapor Deposition) onto a semiconductor substrate containing MOSFET circuit devices, the method comprising the following steps: providing a semiconductor substrate, having MOSFET circuit devices therein; loading the semiconductor substrate, having MOSFET circuit devices therein, into a HDP-CVD (High-Denisty Plasma Chemical Vapor Deposition) system having at least two RF power sources; heating the semiconductor substrate, having MOSFET circuit devices therein, to a temperature in the range between about 400 and 700° C.; flowing process gases into the HDP-CVD system under conditions suitable for depositing said dielectric layer; controlling the RF power to one of the at least two RF power sources in the range between about 1000 and 2000 Watts; controlling the RF power to the second of at least two RF power sources to be less than about 2000 to 2500 Watts: and depositing the dielectric layer to a thickness between about 1000 and 20.000 Angstroms.

And in yet a fourth embodiment of the present invention, the above and other objectives are realized by using a method of forming a dielectric layer by HDP-CVD (High-Density Plasma Chemical Vapor Deposition) onto a semiconductor substrate containing MOSFET circuit devices, the method comprising the following steps: providing a semiconductor substrate, having MOSFET circuit devices therein; loading the semiconductor substrate, having MOSFET circuit devices therein, into a HDP-CVD (High-Denisty Plasma Chemical Vapor Deposition) system having at least two RF power sources; heating the semiconductor substrate, having MOSFET circuit devices therein, to a temperature in the range between about 400 and 700° C.; flowing process gases into the HDP-CVD system under conditions suitable for depositing the dielectric layer; controlling the RF power to one of the at least two RF power sources in the range between about 1000 and 2000 Watts; controlling the RF power to the second of at least two RF power sources in the range between about 1500 and Watts; and depositing the dielectric layer to a thickness less than about 20,000 Angstroms.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The new and improved method of depositing dielectric layers by HDP-CVD (High-Density Plasma Chemical Vapor Deposition) onto semiconductor substrates containing integrated circuit devices, whereby the deposited dielectric layer produces voidless gapfill over high aspect ratio trenches and with minimization of plasma induced damage to underlying semiconductor circuit devices will now be described in detail.

It is known that HDP-CVD processes for depositing dielectric layers can provide voidless gapfill of the dielectric layer for high aspect ratio trenches because of the concurrent deposition and resputtering processes operating during the HDP-CVD processes. Furthermore, no subsequent high temperature anneal or heat treatment of the dielectric layer is required because, as deposited by HDP-CVD processes, the dielectric layer is dense and stable. However, when such HDP-CVD deposited dielectric layers are deposited very close to active devices, such as MOSFET devices having thin gate oxide thicknesses in the range between about 15 and 50 Angstroms, plasma induced damage can occur to the active devices.

State-of-the-art HDP-CVD dielectric deposition, as shown in U.S. Pat. No. 6,004,863, uses: 1. A reactor chamber pressure of from about 3 to about 10 mTorr; 2. A side source of RF (radio frequency) power of from about 2500 to about 3500 Watts; 3. A top source of RF power from about 1000 to about 2000 Watts; 4. A bias sputtering power of from about 1000 to about 3500 Watts; 5. Process gas flows in the range between about 10 and 300 scam. These deposition conditions are not suitable for depositing dielectric layers onto active devices, such as MOSFET devices having thin gate oxide thicknesses. Using these state-of-the-art HDP-CVD deposition conditions results in PID (Plasma Induced Damage) and GOI (Gate Oxide Integrity) failure.

The problems of PID and GOI for MOSFET devices can be eliminated or greatly suppressed by incorporating the following methods into the HDP-CVD processes: 1. Reduce the side source RF power to less than about 2500 Watts during dielectric deposition; 2. Reduce the thickness of the HDP-CVD deposited dielectric layer to less than about 2000 Angstroms.

Figure 1:
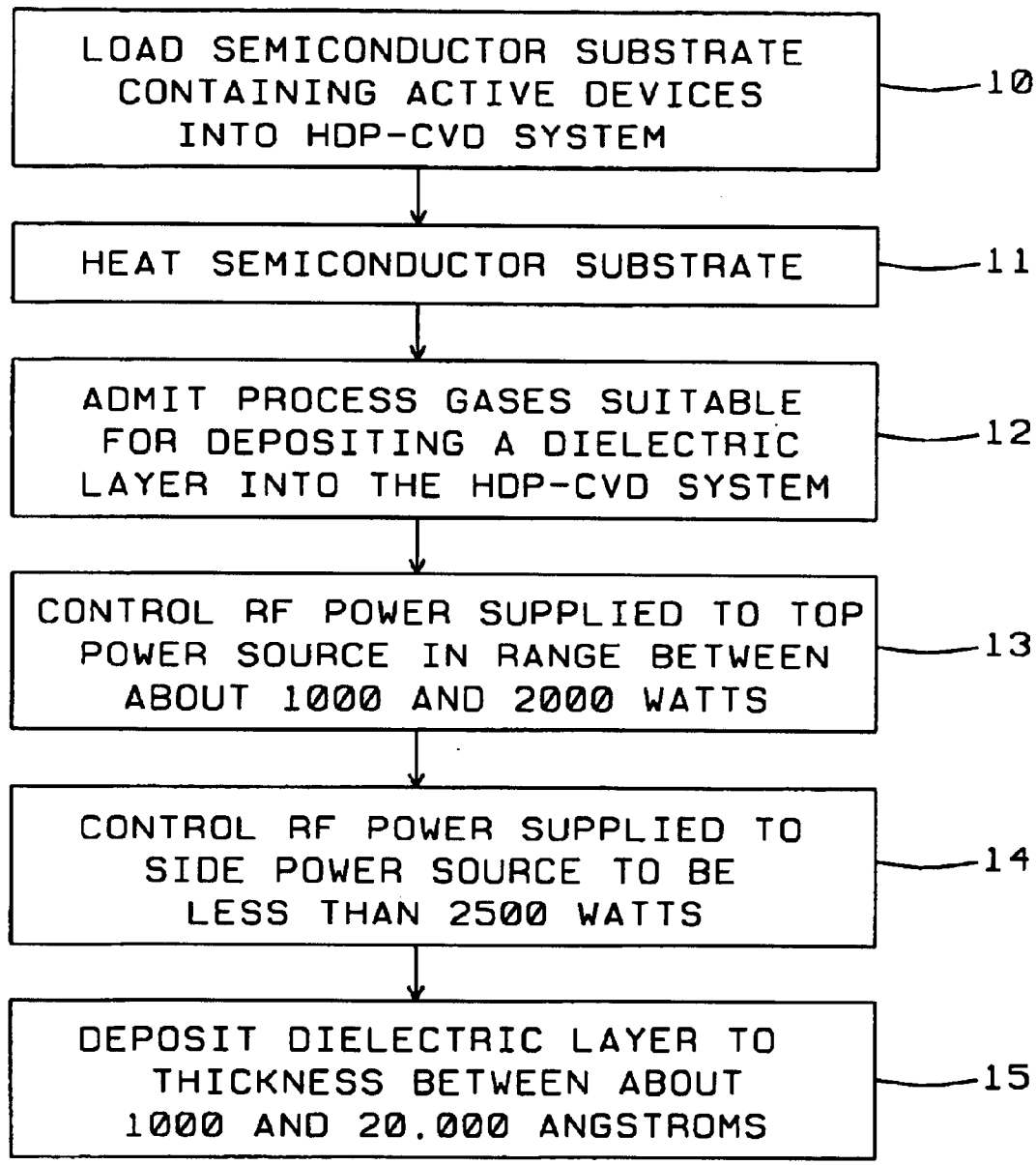
FIG. 1 is a flow chart of the method of the preferred embodiment of the present invention.

Referring to FIG. 1, the basic steps of an example of the method of the present invention are summarized. In Step 10 a semiconductor substrate having active circuit devices, such as MOSFET devices, therein is loaded into a HDP-CVD system having at least two RF power sources. In Step 11 the semiconductor substrate is heated to a temperature in the range between about 400 and 700° C. In Step 12 process gases suitable for depositing the dielectric layer are admitted into the HDP-CVD system. The dielectric layer may be silicon oxide deposited using SiH4 (silane), USG (Undoped Silicon Glass) deposited using HDP-CVD process gases, PSG (Phospho-silicate Glass) deposited using HDP-CVD process gases, or similar dielectrics. In Step 13 the RF power supplied to the top power source in the HDP-CVD system is controlled in the range between about 1000 and 2000 Watts. In Step 14 the RF power supplied to the side power source in the HDP-CVD system is controlled to be less than about 2500 Watts. And then, in Step 15 the dielectric layer is deposited to a thickness between about 1000 and 20,000 Angstroms.

Figure 2:
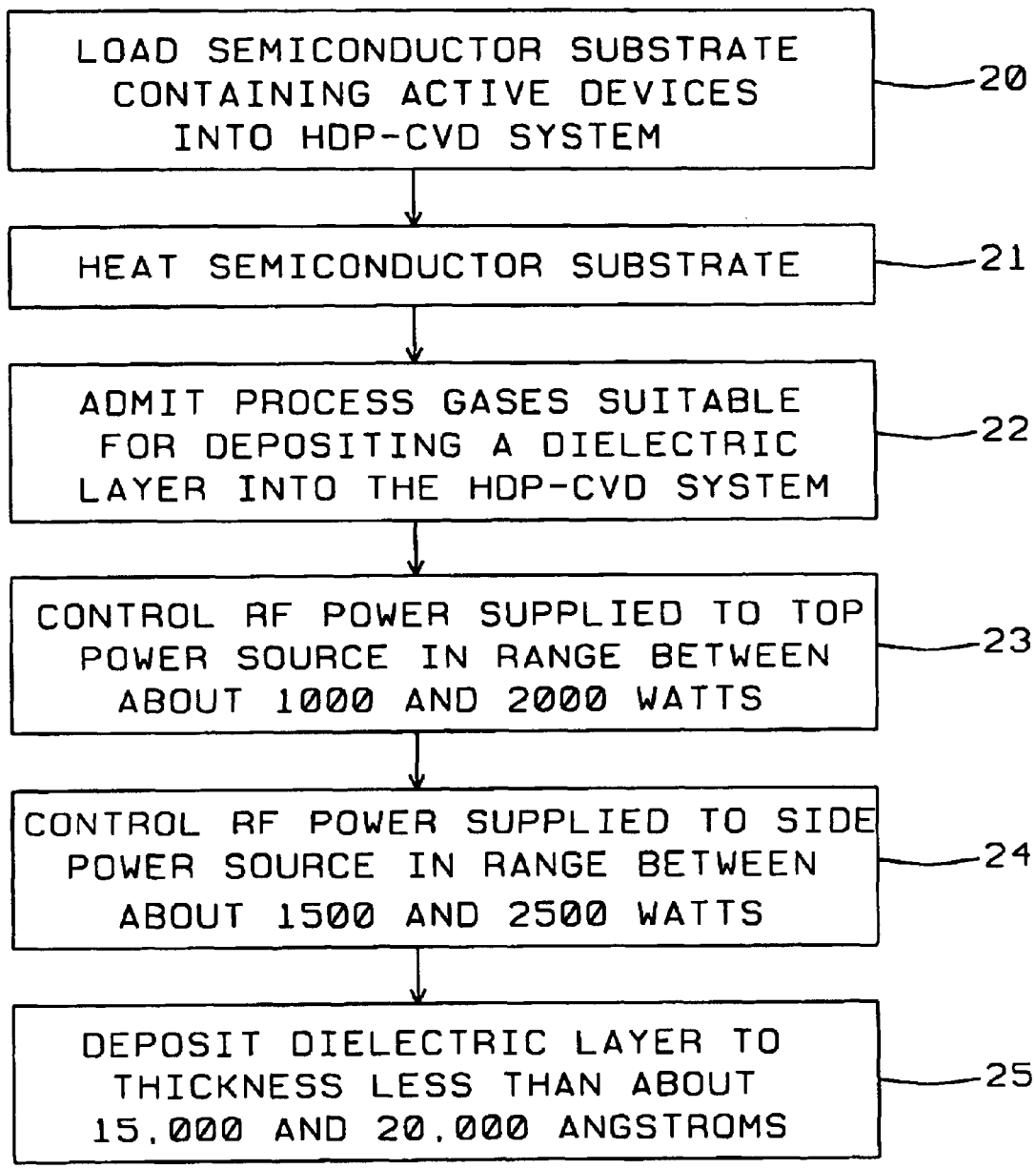
FIG. 2 is a flow chart of the method of a second embodiment of the present invention.

The basic steps of a second embodiment of the present invention are shown in FIG. 2. Referring to FIG. 2, in Step 20 a semiconductor substrate having active circuit devices, such as MOSFET devices, therein is loaded into a HDP-CVD system having at least two RF power sources. In Step 21 the semiconductor substrate is heated to a temperature in the range between about 400 and 700° C. In Step 22 process gases suitable for depositing the dielectric layer are admitted into the HDP-CVD system. The dielectric layer may be silicon oxide deposited using $SiH_4$ (silane), USG (Undoped Silicon Glass) deposited using HDP-CVD process gases, PSG (Phospho-silicate Glass) deposited using HDP-CVD process gases, or similar dielectrics. In Step 23 the RF power supplied to the top power source in the HDP-CVD system is controlled in the range between about 1000 and 2000 Watts. In Step 24 the RF power supplied to the side power source in the HDP-CVD system is controlled in the range between about 1500 and 2500 Watts. And then, in Step 25 the dielectric layer is deposited to a thickness less than between about 15,000 and 20,000 Angstroms.

While the invention has been particularly shown and described with reference to the preferred embodiments thereof, it will be understood by those skilled in the art that various changes in form and details may be made without departing from the spirit and scope of the invention.

What is claimed is:

1. A method of forming a dielectric layer by HDP-CVD (High-Density Plasma Chemical Vapor Deposition) onto a semiconductor substrate containing active circuit devices, the method comprising the following steps: providing a semiconductor substrate, having active circuit devices therein;

loading said semiconductor substrate, having active circuit devices therein, into a HDP-CVD (High-Density Plasma Chemical Vapor Deposition) system having at least two RF power sources;

heating said semiconductor substrate, having active circuit devices therein, to a temperature in the range between about 400 and 700° C.;

flowing process gases into the HDP-CVD system under conditions suitable for depositing said dielectric layer;

controlling the RF power to one of the at least two RF power sources in the range between about 1000 and 2000 Watts;

controlling the RF power to the second of at least two RF power sources, where the second of at least two RF power sources is a side source, to be less than 2500 Watts; and depositing said dielectric layer to a thickness between about 1000 and 20,000 Angstroms.

2. The method of claim 1, wherein said dielectric layer is silicon oxide deposited using $SiH_4$ (silane).

3. The method of claim 1, wherein said dielectric layer is USG (Undoped Silicon Glass) deposited using HDP-CVD process gases.

4. The method of claim 1, wherein said dielectric layer is PSG (Phosphosilicate Glass) deposited using HDP-CVD process gases.

5. A method of forming a dielectric layer by HDP-CVD (High-Density Plasma Chemical Vapor Deposition) onto a semiconductor substrate containing active circuit devices, the method comprising the following steps:

providing a semiconductor substrate, having active circuit devices therein;

loading said semiconductor substrate, having active circuit devices therein, into a HDP-CVD (High-Denisty Plasma Chemical Vapor Deposition) system having at least two RF power sources;

heating said semiconductor substrate, having active circuit devices therein, to a temperature in the range between about 400 and 700° C.;

flowing process gases into the HDP-CVD system under conditions suitable for depositing said dielectric layer;

controlling the RF power to one of the at least two RF power sources in the range between about 1000 and 2000 Watts;

controlling the RF power to the second of at least two RF power sources, where the second of at least two RF power sources is a side source, to be less than 2500 Watts; and depositing said dielectric layer to a thickness less than between about 15,000 and 20,000 Angstroms.

6. The method of claim 5, wherein said dielectric layer is silicon oxide deposited using $SiH_4$ (silane).

7. The method of claim 5, wherein said dielectric layer is USG (Undoped Silicon Glass) deposited using HDP-CVD process gases.

8. The method of claim 5, wherein said dielectric layer is PSG (Phosphosilicate Glass) deposited using HDP-CVD process gases.

9. A method of forming a dielectric layer by HDP-CVD (High-Density Plasma Chemical Vapor Deposition) onto a semiconductor substrate containing MOSFET circuit devices, the method comprising the following steps:

providing a semiconductor substrate, having MOSFET circuit devices therein;

loading said semiconductor substrate, having MOSFET circuit devices therein, into a HDP-CVD (High-Denisty Plasma Chemical Vapor Deposition) system having at least two RF power sources;

heating said semiconductor substrate, having MOSFET circuit devices therein, to a temperature in the range between about 400 and 700° C.;

flowing process gases into the HDP-CVD system under conditions suitable for depositing said dielectric layer;

controlling the RF power to one of the at least two RF power sources in the range between about 1000 and 2000 Watts;

controlling the RF power to the second of at least two RF power sources, where the second of at least two RF power sources is a side source, to be less than 2500 Watts; and depositing said dielectric layer to a thickness between about 1000 and 20,000 Angstroms.

10. The method of claim 9, wherein said dielectric layer is silicon oxide deposited using $SiH_4$ (silane).

11. The method of claim 9, wherein said dielectric layer is USG (Undoped Silicon Glass) deposited using HDP-CVD process gases.

12. The method of claim 9, wherein said dielectric layer is PSG (Phosphosilicate Glass) deposited using HDP-CVD process gases.

13. A method of forming a dielectric layer by HDP-CVD (High-Density Plasma Chemical Vapor Deposition) onto a semiconductor substrate containing MOSFET circuit devices, the method comprising the following steps:

providing a semiconductor substrate, having MOSFET circuit devices therein;

loading said semiconductor substrate, having MOSFET circuit devices therein, into a HDP-CVD (High-Denisty Plasma Chemical Vapor Deposition) system having at least two RF power sources;

heating said semiconductor substrate, having MOSFET circuit devices therein, to a temperature in the range between about 400 and 700° C.;

flowing process gases into the HDP-CVD system under conditions suitable for depositing said dielectric layer;

controlling the RF power to one of the at least two RF power sources in the range between about 1000 and 2000 Watts;

controlling the RF power to the second of at least two RF power sources, where the second of at least two RF power sources is a side source, to be less than 2500 Watts; and depositing said dielectric layer to a thickness less than between about 15,000 and 20,000 Angstroms.

14. The method of claim 13, wherein said dielectric layer is silicon oxide deposited using $SiH_4$ (silane).

15. The method of claim 13, wherein said dielectric layer is USG (Undoped Silicon Glass) deposited using HDP-CVD process gases.

16. The method of claim 13, wherein said dielectric layer is PSG (Phosphosilicate Glass) deposited using HDP-CVD process gases.

* * * * *